United States Patent
Grumbine et al.

(10) Patent No.: US 6,582,623 B1
(45) Date of Patent: Jun. 24, 2003

(54) CMP COMPOSITION CONTAINING SILANE MODIFIED ABRASIVE PARTICLES

(75) Inventors: Steven K. Grumbine, Aurora, IL (US); Christopher C. Streinz, Patten, ME (US); Shumin Wang, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 09/609,884

(22) Filed: Jul. 5, 2000

Related U.S. Application Data
(60) Provisional application No. 60/142,706, filed on Jul. 7, 1999.

(51) Int. Cl.$^7$ .................. C09K 13/00; H01L 21/302
(52) U.S. Cl. ................ 252/79.1; 252/79.2; 252/79.3; 252/79.4; 252/79.5
(58) Field of Search ........................... 252/79.1, 79.2, 252/79.3, 79.4, 79.5

(56) References Cited

U.S. PATENT DOCUMENTS

| | | | |
|---|---|---|---|
| 4,563,483 A | | 1/1986 | Smith et al. |
| 5,226,930 A | * | 7/1993 | Sasaki ................ 51/308 |
| 5,645,736 A | | 7/1997 | Allman |
| 5,767,016 A | | 6/1998 | Muroyama |
| 6,372,648 B1 | | 4/2002 | Hall et al. |

FOREIGN PATENT DOCUMENTS

| | | | |
|---|---|---|---|
| JP | 10-180619 | * | 7/1998 |
| WO | 2001004226 | * | 1/2001 |

* cited by examiner

*Primary Examiner*—George Goudreau

(57) ABSTRACT

A polishing composition comprising a dispersion of silane modified abrasive particles formed by combining at least one metal oxide abrasive having at least one surface metal hydroxide with at least one silane compound and methods for polishing substrate features such as metal features and oxide features using the polishing compositions.

21 Claims, No Drawings

CMP COMPOSITION CONTAINING SILANE MODIFIED ABRASIVE PARTICLES

This application claims priority to U.S. Provisional Patent Application Ser. No. 60/142,706 filed on Jul. 7, 1999.

BACKGROUND OF THE INVENTION

(1) Field of the Invention

This invention concerns a CMP composition comprising a dispersion of silane modified metal oxide abrasive particles that are the product of the combination of an abrasive having surface metal hydroxides and a silane compound including at least one non-hydrolyzable substituent. This invention is also a method for using silane modified abrasive particle dispersions to polish features associated with a substrate surface as well as methods of polishing substrate features using abrasive containing polishing pads that have been modified with silane solutions.

(2) Description of the Art

Great advances are being made in the miniaturization of electronic components used in the computer and electronic industries. The miniaturization of electronic components typically involves depositing, etching and/or polishing multiple metal and oxide layers to build up an electronic substrate. Miniaturization however has created component quality concerns, many of which are overcome by precisely polishing the computer and electronic substrate materials. In order to polish electronic component surfaces precisely it has become necessary to develop chemical mechanical polishing slurries that are compatible with the combination of surfaces being polished.

One component of chemical mechanical polishing slurries that has seen very little improvement is the abrasive. Typically, metal oxide abrasives are used in chemical mechanical polishing slurries. Little effort has been made to improve slurry abrasives other than refining the abrasive particle size or the types of abrasive particles used in the slurries.

Recently, there have been several attempts to modify the surface chemistry of abrasive particles. For example, U.S. Pat. No. 5,645,736 discloses a method for polishing a work piece that uses organopolysiloxane polymers to disperse and hold the abrasive particles in a temporary film or matrix on the substrate being polished. U.S. Pat. No. 5,767,106 discloses a polishing composition including abrasive particles that have been combined with organo metallic compounds such as γ-aminopropyl triethoxy silane. The particles are subsequently used in a slurry to polish a semiconductor device.

Despite these improvements, there remains a need for chemical mechanical polishing compositions that can be tailored to polish specific combination of metal and/or oxide layers associated with an electronic substrate. More particularly, there remains a need for abrasive particles that can be tailored to polish specific metal and/or dielectric layers at controlled rates while minimizing substrate defectivity.

SUMMARY OF THE INVENTION

The present invention includes a chemical mechanical polishing composition comprising a dispersion of silane modified abrasive particles that are the product of the combination of at least one metal oxide abrasive that includes at least one surface metal hydroxide and at least one silane compound the includes at least one non-hydrolyzable substituent.

In another embodiment, this invention is a chemical mechanical polishing composition comprising a dispersion including at least one silane modified abrasive particle that is the product of the combination of a metal oxide abrasive having at least one surface metal hydroxide and at least one silane compound having the formula:

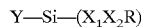

dimers, trimers and oligomers thereof, wherein Y is hydroxy (—OH) or a hydrolyzable substituent, $X_1$ and $X_2$ are each independently selected from hydroxy, a hydrolyzable substituent, and a non-hydrolyzable substituent, and R is a non-hydrolyzable substituent wherein each non-hydrolyzable substituent is independently selected from the group consisting of alkyl, cycloalkyl, aromatic, functionalized alkyl, functionalized aromatic, and functionalized cycloalkyl, each of which may be substituted with one or more atoms selected from oxygen, nitrogen, sulfur, phosphorous, halogen and combinations thereof wherein the silane is not an aminosilane.

In yet another embodiment, this invention includes methods for polishing a substrate that includes at least one surface feature. The method includes the steps of preparing a chemical mechanical polishing slurry comprising a solution selected from water and an organic solvent, and the combination of metal oxide abrasives including at least one surface metal hydroxide and at least one silane compound that includes at least one non-hydrolyzable substituent to give a silane modified abrasive particle. The polishing slurry is then applied to a polishing pad, the substrate feature is brought into contact with the polishing pad, and the substrate surface feature is moved in relationship to the polishing pad until at least a portion of the feature is removed from the substrate.

In yet another embodiment, this invention is a method for preparing a polishing pad for polishing comprising the steps of applying a silane solution to an polishing pad including at least one abrasive particle that includes a surface metal hydroxide to form a silane modified abrasive particle, bringing a substrate including at least one surface feature into contact with the polishing pad, and moving the substrate in relationship to the polishing pad to remove at least a portion of the surface of the feature from the substrate.

The compositions and methods of the present invention have been found to provide controllable polishing characteristics to both the dielectric layer and metal layer of an integrated circuit.

DESCRIPTION OF THE CURRENT EMBODIMENT

The present invention relates to chemical mechanical polishing compositions comprising a dispersion of silane modified abrasive particles that are the product of the combination of at least one metal oxide abrasive particle including at least one surface metal hydroxide and at least one silane compound that includes at least one non-hydrolyzable substituent. This invention is also a method for polishing a substrate feature using a dispersion of silane modified abrasive particles. This invention further includes methods for using silane solutions to modify abrasives in abrasive containing polishing pads.

The term "substrate feature" as it is used herein refers to electronic substrate features such as vias and copper interconnect lines, and to layers of materials deposited on or in the features such as dielectric layers, low-k material layers, adhesion layers, metal layers, and so forth. The polishing compositions of this invention are useful for polishing substrates to remove material layers, as well as for polishing exposed substrate features.

Abrasives that are useful in the CMP compositions of this invention must include at least one surface metal hydroxide compound. The term "surface metal hydroxide compound" refers to the structure P—OH wherein P refers to the abrasive particle. In addition, the surface metal hydroxide compound must be accessible to one or more silane containing compounds in order to form the silane modified abrasives of this invention. Thus, preferred surface metal hydroxide compound containing abrasives of this invention may be selected from metal oxide abrasives including alumina, titania, zirconia, germania, silica, ceria, tantalum oxide ($TaO_x$), mixtures thereof, and chemical admixtures thereof. The term "chemical admixture" refers to particles including atomically mixed or coated metal oxide abrasive mixtures. A most preferred metal oxide abrasive is silica (silicon dioxide).

The abrasive particles useful in this invention may consist of metal oxide aggregates or individual single particles. The term "particle" as it is used herein refers to both aggregates of more than one primary particle and to single particles. Preferred metal oxide particles are silica and aluminum with silica being most preferred.

The metal oxide abrasives used in the present invention may be produced by any techniques known to those skilled in the art to give abrasive particles having the characteristics reported above. Metal oxide abrasives useful in this invention are derived from processes including flame processes, sol-gel processes, hydrothermal processes, plasma processes, aerogel processes, fuming processes, precipitation processes, mechanochemical milling, mining, and by any combination of these processes just so long as the abrasive includes surface metal hydroxides.

The metal oxide abrasive particles are combined with at least one silane composition to form silane modified abrasive particles. Any silane composition that is capable of combining with the metal hydroxide component of an abrasive particle may be used in this invention so long as the silane includes at least one non-hydrolyzable substituent. Some classes of silane compounds useful in the present invention include alkoxysilanes, alkylsilanes, functionalized silanes, disilanes, trisilanes, and combinations thereof.

Preferred silane compositions have the formula:

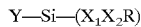

and include dimers, trimers and oligomers thereof wherein the term "oligomers" refers to a compound containing from 4 to 15 siloxane units. In the formula above, Y is hydroxy (—OH) or a hydrolyzable substituent, $X_1$ and $X_2$ are each independently selected from hydroxy, a hydrolyzable substituent and R is a non-hydrolyzable moiety. In a preferred embodiment the silane composition will have the formula above wherein Y is hydroxy (—OH) or a hydrolyzable substituent, R is a non-hydrolyzable substituent, and $X_1$ and $X_2$ are each individually non-hydrolyzable substituents. From the formulas above, it is clear that the silanes used in this invention must contain one hydrolyzable substituent, Y and they must contain one non-hydrolyzable substituent, R. $X_1$ and $X_2$ may each be hydrolyzable, non-hydrolyzable or one may be a hydrolyzable substituent while the other is a non-hydrolyzable substituent.

Generally, "hydrolyzable" substituents are those compounds that will form Si(OH) in an aqueous system. Such moieties include, but are not limited to alkoxides, halogens such as Cl, carboxylate, and amides. Non-hydrolyzable moieties are any compounds that do not undergo hydrolysis to form Si(OH) in an aqueous solution.

The non-hydrolyzable substituents are each independently selected from alkyl, cycloalkyl, aromatic, functionalized alkyl, functionalized aromatic, functionalized cycloalkyl, alkene, alkylsilane, one or more of which carbon atoms may be substituted with one or more atoms selected from oxygen, nitrogen, sulfur, phosphorous, halogen, silicon, and combinations thereof wherein each non-hydrolyzable substituent include from 1 to 100 carbon atoms and preferably 2 to 25 carbon atom and most preferably 2 to 10 carbon atoms.

Preferably, each non-hydrolyzable substituent is selected from the group of compounds consisting of alkyl, functionalized alkyl, and mixtures thereof having from 2 to 25 carbon atoms. More preferably each non-hydrolyzable substituent is a functionalized alkyl selected from the group consisting of alkylnitriles, alkylamides, alkylcarboxylic acids, alkyl halide, alcohol, alkyluriedo, and mixtures thereof. Most preferably, at least one of the non-hydrolyzable substituents is functionalized propyl alkyl.

When $X_1$ and $X_2$ are both hydroxy or a hydrolyzable substituent, then the silane compound is preferably selected from the group consisting of glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-dihydro-1-(3-trialkoxysilylpropyl) imidazole, 3-(trialkoxysilyl)-methyl ester propanoic acid, trialkoxy[3-(oxiranylalkoxy)propyl]-silane, 2-methyl, 3-(trialkoxysilyl)propyl ester 2-propenoic acid, [3-(trialkoxysilyl)propyl]urea, and mixtures thereof.

When one substituent selected from $X_1$ and $X_2$ is a non-hydrolyzable substituent then the silane is preferably selected from the group of silanes consisting of chloropropylmethyldialkoxysilane, 1,2-ethanediylbis[alkoxydimethyl] silane, dialkoxymethylphenyl silane, and mixtures thereof.

When $X_1$ and $X_2$ are each non-hydrolyzable moieties then the silane is preferably selected from the group of silanes consisting of cyanopropyldimethylalkoxysilane, N,N'-(alkoxymethylsilylene)bis[N-methyl-benzamide], chloromethyldimethylalkoxysilane, and mixtures thereof.

For purposes of this invention, the term "alkoxy" as it is used in the silane names refers to the hydrolyzable group and may include —OR, Cl, Br, I, and NRR' wherein R and R' may include from 1 to 20 carbon atoms.

For most aspects of this invention, except for the methods for modifying abrasive containing polishing pads with a silane composition, it is preferred that the silane is not an aminosilane The selection of R, $X_1$ and $X_2$ will generally depend upon the polishing qualities desired of the resulting silane modified abrasive. The selection of components corresponding to R, $X_1$ and $X_2$ enables the silane modified abrasive to be useful in specific polishing applications. For example, substituents $R_1$, $X_1$ and $X_2$ can be selected to enhance the polishing rate of a first metal layer and inhibit the polishing rate of a second metal layer. Alternatively, the substituents can be selected in order to enhance the polishing rates of two or more metals, to inhibit the polishing rates of two or more metals or to inhibit or enhance the polishing rates of combinations of metal and oxide layers.

The silane modified abrasive particles of this invention are generally represented by the formula: P—O(H)—Si—$X_1X_2R$. It is an important aspect of this invention that the silane compound is associated with the abrasive particle.

This association is depicted in the formula by the dashed line (—) between the particle, (P) and the oxygen atom (O). The term "associated with" as used herein refers to any type of bond that unites the abrasive particle with at least one silanol compound. Examples of such bonds include covalent bonds from condensation, chemabsorption, physical absorption, hydrogen bonding, and/or Van der Waals association.

The silane modified abrasive particles of this invention may include a single silane associated with a single particle surface hydroxide, or a single silane compound associated with the particle at multiple locations. In an alternate embodiment, the silane modified abrasive particle may be modified with a silane dimer, trimer, oligomer where each silane dimer, trimer or oligomer is associated with a single or with multiple surface metal hydroxide locations on a particle.

The silane modified particles of this invention should have a silane "coverage" that is sufficient to achieve the desired polishing results. The term "coverage" refers to the percentage of particle surface hydroxides that are associated with a siloxane. Generally the silane coverage will range from about 10 to about 99% or more. However, more than a mono-layer coverage is acceptable.

The silane modified abrasive particles of this invention can be incorporated into chemical mechanical polishing slurries or into abrasive containing polishing pads that are useful for polishing a myriad of substrate layers including metal layers, adhesion layers and oxide layers in conjunction with the manufacture of integrated circuits and other electronic substrates. Examples of layers that may be polished by the silane modified abrasive particles of this invention include copper, aluminum, nickel, nickel phospide, tungsten, titanium, titanium nitride, tungsten nitride, silicon, germania, silicon dioxide, silicon nitride, layers including combinations thereof and so forth.

When the silane modified abrasive particles are used to polish an oxide or dielectric feature associated with a substrate surface, such as ultra low-k material, silicon oxide, aluminum oxide, phosphorous, or boron doped silica, and polishing rate reduction is required, then it is preferred that the silane composition used to modify the abrasive particles includes one or two hydroxy and/or hydrolyzable moieties. Referring to the silane structure above, R and $X_1$ will preferably be a non-hydrolyzable substituent, $X_2$ may be selected from hydroxy, a hydrolyzable substituent and a non-hydrolyzable substituent, and Y is hydroxy or another hydrolyzable substituent. The minimization of hydroxy groups and hydrolyzable moieties in such a polishing application is desired because the presence of silanols on the surface of the abrasive particles promotes rapid and sometimes uncontrollable polishing of an oxide layer. As a result, minimizing and essentially eliminating silanol compounds from the abrasive surface promotes the control of oxide layer polishing.

The R substituent of the useful silane may be appropriately sized to function in one of two ways. First the selection of the R substituent size, i.e. number of atoms, can modify the mechanical aspect of the particle. That is when R includes a large number of atoms, the R substituent can modify the physical characteristics of the particle such as morphology, size, and hardness, which in turn has an impact on the defectivity of the substrates polished with the silane modified abrasive particles of this invention. A large R group can also shield any abrasive surface hydroxides that did not react with the silane and make them less accessible during polishing thereby preventing the available surface hydroxides from participating in oxide layer polishing.

Alternatively, the R group and the other substituents can be selected to impact the manner in which the silane modified abrasive particle chemically interacts with the substrate feature being polished. Altering the chemical aspects of the chemical treated abrasive particles allows the particles to be tailored as polishing promoters, polishing inhibitors, or a combination thereof.

It is preferred that the number of hydroxy groups and hydrolyzable moieties associated with the silane modified abrasives of the CMP compositions of this invention are minimized.

Therefore, it is preferred that either $X_1$ or $X_2$ along with R are non-hydrolyzable moieties. It is most preferred that both $X_1$, $X_2$ and R are all non-hydrolyzable moieties.

Examples of useful silanes having non-hydrolyzable moieties include alkyl silanes; functionalized alkyl silanes such as alkyl epoxides, alkyl hydroxides, alkylnitriles, alkylcarboxylic acids, and alkylamides; aromatic silanes; heterocyclic silanes; and mixtures thereof. Specific examples of useful non-hydrolyzable silane compositions include, but are not limited to glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-lo dihydro-1-(3-trialkoxysilylpropyl)imidazole, 3-(trialkoxysilyl)-methyl ester propanoic acid, trialkoxy[3-(oxiranylalkoxy)propyl]-silane, 2-methyl, 3-(trialkoxysilyl) propyl ester 2-propenoic acid, [3-(trialkoxysilyl)propyl] urea, chloropropylmethyldialkoxysilane, 1,2-ethanediylbis [alkoxydimethyl] silane, dialkoxymethylphenyl silane, cyanopropyldimethylalkoxysilane, N,N'-(alkoxymethylsilylene)bis[N-methyl-benzamide], chloromethyldimethylalkoxysilane, and mixtures thereof.

The silanes used to prepare the silane modified abrasives of this invention can be chosen to enhance oxide feature polishing rates. In order to enhance oxide feature polishing rates, the silanes used to modify the abrasive particles will preferably include a substituent R that includes an oxide polishing accelerator such as a hydroxy or fluoride moiety. A preferred oxide rate enhancing silane compound is glycidoxypropyltrialkoxysilane which hydrolyzes to a diol.

In addition to polishing oxide layers, the polishing compositions of this invention can be used to polish one or more metal features associated with substrates. Silane modified abrasive particles that are used to polish substrate metal features will preferably be modified by silanes having the formula disclosed above wherein at least one of the non-hydrolyzable substituents—R, and optionally $X_1$ or $X_2$ or combinations thereof includes a polishing accelerator moiety. Metal polishing accelerator moieties can be any moieties that are known in the art to promote metal dissolution during chemical mechanical processes. Examples of metal polishing accelerator moieties include, but are not limited to carboxylic acids, phosphonic acids, thiols, nitriles, phosphates and mixtures thereof. Silane compounds that are useful in preparing silane modified polishing agents for enhanced metal polishing include, but are limited to, methacryloxypropyltrialkoxysilane, isocyanatopropyltrialkoxysilane, ureidopropyltrialkoxysilane, mercaptopropyltrialkoxysilane, cyanoethyltrialkoxysilane, isocyanatopropyltrialkoxysilane, 4,5-dihydro-1-(3-trialkoxysilylpropyl)imidazole, and mixtures thereof.

The silane modified abrasive particles of this invention are prepared as a dispersion. The solvent used in the dispersion may be selected from water or a organic solvent that is capable of forming hydroxy groups of the surface of the abrasive particles once the abrasive particles are dispersed in the solvent. Preferred solvents are alcohols and water with water being most preferred.

The polishing compositions of this invention may include one or more optional chemical mechanical polishing slurry additives. Examples of useful polishing slurry additives include complexing agents, oxidizing agents, catalysts, stabilizers, dispersants, surfactants, corrosion inhibitors, buffers, compounds for adjusting solution pH and so forth. Any ingredients that are known in the art to be useful in chemical mechanical polishing slurries and compositions may be incorporated into the silane modified abrasive particle polishing composition dispersions of this invention.

The polishing compositions of this invention may have a pH of from 2 to 11, with a pH in the range of 5 to 9 being preferred.

The polishing compositions of this invention can be tailored for particular polishing application by modifying the abrasive particles with one or more than one silane composition to give particles modified with a mixture of silanes. When the metal hydroxide containing abrasive particle is combined with more than one silane composition, the relative amounts of silane compositions may be adjusted to achieve a silane modified abrasive particle having the desired polishing properties. Alternatively, the silane modified abrasive particles of this invention may comprise a first modified abrasive particle that has been modified with a first silane composition and a second modified abrasive particle that has been modified with a second silane composition. In fact, mixtures of two, three or four or more abrasive particles each individually modified with distinct silane compositions may be incorporated into chemical mechanical polishing slurries of this invention.

The silane modified abrasive particles of this invention and combinations thereof may be incorporated into a chemical mechanical polishing slurry. Alternatively, the silanes may be incorporated into a solution and applied to an abrasive containing pad whereby the abrasive which include metal hydroxides are modified continuously during the polishing process. Examples of polishing pads including examples of abrasive containing pads are disclosed in U.S. Pat. Nos. 5,849,051 and 5,849,052, the specifications of which are incorporated here by reference. Abrasive containing polishing pads may be modified with silane containing solutions prior to, during or following substrate polishing with modification immediately prior to and during substrate polishing being most preferred. The silane "solutions" discussed above include solutions of silanes dissolved in a solvent as well as silane/solvent emulsions.

There are no limitations on how the abrasive particles of this invention are applied to a substrate or polishing pad for polishing. What is important is that the abrasive particles used include a surface hydroxide that has combined with a silane composition.

The silane modified abrasive particles of this invention may be prepared by any methods known for associating a silane composition with surface metal hydroxide containing abrasive particles. In one method, the silane compositions may be dissolved in a solvent such as water and sprayed onto the surfaces of abrasive particles which are thereafter dried to produce silane modified abrasive particles. Once dried, the silane modified abrasive particles can be incorporated into a dispersion. Alternatively, the silane modified abrasive particles can be prepared by combining a surface metal hydroxide containing abrasive particles with a solvent such as water and mechanically dispersing the abrasives in the solvent. Once the abrasive particles are dispersed in the solvent, a silane composition or solution may be added to the dispersion to produce a silane modified abrasive particle where the silane bonds to the metal hydroxide of the surface of the abrasive predominantly by a method other than covalent bonding such as hydrogen bonding. The silane modified abrasive particles can be separated from the treating solution and dried or the dispersion of silane modified abrasive particles can be used directly in the manufacture of a chemical mechanical polishing slurry.

It is preferred that the dispersion and/or the chemical mechanical polishing slurry using the dispersed silane modified abrasives of this invention includes less than about 15 wt % silane modified abrasive particles. It is most preferred that when the silane modified abrasive particles are used for polishing metal layers, that the final chemical mechanical polishing composition includes from about 0.1 to 7 wt % silane modified abrasive particles. When the silane modified abrasive is used to polish an oxide layer, it is preferred that the polishing composition include from about 5 to about 15 wt % silane modified abrasive particle.

In addition to tailoring polishing composition polishing performance by tailoring the silanes used to modify the abrasive particles used in the polishing compositions of this invention, the abrasive particles that are modified with silane compositions may stabilize the dispersed polishing compositions that include the modified abrasive particles. More particularly, dispersions of silane modified abrasive particles may be less prone to agglomeration and settling when incorporated into an aqueous solution. Therefore, silane modified abrasive particle dispersions may have an improved shelf life stability in comparison to unmodified abrasive particle dispersions.

Preferably, the silane modified abrasives may be incorporated into the aqueous CMP polishing slurries as a concentrated aqueous dispersion that ranges from about 3% to about 45% solids, and preferably between 10% and 20% solids. The aqueous dispersion of silane modified abrasives may be produced using conventional techniques, such as by slowly adding the metal oxide abrasive to an appropriate media, for example, deionized water, to form a colloidal dispersion. The dispersion is typically completed by subjecting it to high shear mixing conditions known to those skilled in the art.

The polishing compositions of this invention are used to polish substrate features by conventional means using conventional polishing machines. The polishing compositions of this invention may be applied directly to the substrate, they may be applied to a polishing pad, or they may be applied to both in a controlled manner during substrate polishing. It is preferred however that polishing compositions are applied to a polishing pad which thereafter is brought into contact with the substrate surface after which the pad is moved in relationship to the substrate surface in order to achieve substrate polishing. Polishing compositions of this invention are then continuously or intermittently applied to the polishing pad in order to maintain a sufficient amount of polishing composition at the pad/substrate surface. When the polishing end point is reached, the flow of polishing composition to the polishing pad is interrupted and excess polishing composition is washed from the substrate with deionized water or another solvent.

EXAMPLE 1

Silane modified silica abrasive particles were incorporated into CMP slurries in this example. The abrasive was a dispersion of fumed silica (LM150 grade) manufactured by Cabot Corp. and incorporated into the slurry at 5.0 wt %. In addition to containing the abrasive and a silane compound, the slurries included 4.0 wt % hydrogen peroxide, 0.018 wt % ferric nitrate nonahydrate, 0.014 wt % malonic acid, 0.042 wt % pyrazine. The slurry pH was adjusted to 2.3 with nitric acid.

The slurries were used to polish patterned tungsten wafers using a Rodel IC 1000 perforated pad on an IPEC 472 machine at a 5 psi downforce, a table speed of 60 rpm, a carrier speed of 40 rpm and a slurry flow rate of 150 ml/min. The results are reported in Table 1 below.

The patterned wafers were polished to a visual endpoint and then polished an extra 20% to remove residual metal and provide the typical process margin required in a manufacturing environment.

TABLE 1

| Run | Silane | W rate Å/min | endpoint time (sec) | overpolish time (sec) | Remaining oxide in field area (Å) |
|---|---|---|---|---|---|
| 1 | none | 3581 | 133 | 27 | 5040 |
| 2 | 0.39 wt % 3-cyanopropyl dimethyl chlorosilane | 2579 | 181 | 36 | 5186 |

The Table 1 polishing results show a substantial reduction of oxide loss in the field area by utilizing the CMP compositions of the present invention containing silane modified silica abrasive particles (e.g. the field is thicker). This reduction is evident even though the CMP slurry with the silane modified abrasive polished for a longer time on the field.

EXAMPLE 2

Silane modified abrasive particles were incorporated into CMP slurries in this example. The abrasive particles were a dispersion of fumed silica (LM150 grade) manufactured by Cabot Corp. and incorporated into the slurry at 2.0 wt %. A silane compound was added to the abrasive dispersion, as was 4.0 wt % hydrogen peroxide, 0.036 wt% ferric nitrate nonahydrate, 0.028 wt% malonic acid and 0.02 wt % glycine. The slurry pH was adjusted to 2.3 with nitric acid.

Both slurries were used to polish blanket tungsten and BPSG oxide wafers using a Rodel IC 1000 perforated pad on an IPEC 472 machine at a 5 psi downforce, a table speed of 60 rpm, a carrier speed of 40 rpm and a slurry flow rate of 150 ml/min. The polishing results are reported in Table 2 below.

TABLE 2

| Run | Silane | W rate Å/min | BPSG oxide rate Å/min |
|---|---|---|---|
| 3 | None | 2301 | 229 |
| 4 | 0.084 wt % 3-Cyanopropyl dimethyl chlorosilane | 2328 | 178 |

The BPSG wafers were polished for 1 min and the dispersion with the silane modified abrasive showed a significant reduction in blanket oxide polishing rate.

EXAMPLE 3

Silane modified silica abrasive particles were incorporated into CMP slurries in this example. The abrasive was a dispersion of fumed silica (LM150 grade) manufactured by Cabot Corp. and incorporated into the slurry at 3.0 wt %. A silane compound was added to the abrasive dispersion as was 4.0 wt % hydrogen peroxide, 0.036 wt % ferric nitrate nonahydrate, 0.028 wt % malonic acid, and 0.057 wt % pyrazine. The slurry pH was adjusted to 2.3 with nitric acid.

The slurries were used to polish blanket tungsten and patterned tungsten wafers using a Rodel IC 1000 perforated pad on an IPEC 472 machine at a 5 psi downforce, a table speed of 60 rpm, a carrier speed of 40 rpm and a slurry flow rate of 150 ml/min and the results are reported in Table 3.

TABLE 3

| # | Silane | W rate Å/min | change in oxide thickness in field area of patterned wafer after 45 sec overpolish |
|---|---|---|---|
| 5 | none | 2580 Å/min | Δ thickness = 76 Å |
| 6 | 0.13 wt % 3-cyanopropyl dimethylchlorosilane | 2779 Å/min | Δ thickness = 41 Å |
| 7 | 0.19 wt % gamma glycidoxypropyl trimethoxysilane | 2539 Å/min | Δ thickness = 116 Å |

The patterned wafers had been previously polished to a visual endpoint plus an extra 20%. The slurries of this Example were evaluated to determine the effect of the silane modified abrasive in the CMP compositions on polishing during a 45 second overpolish when tungsten vias and PETEOS oxide are both exposed. The data shows a reduction of oxide loss in the field area after adding the silane, 3-cyanopropyl dimethylchlorosilane while the silane glycidoxypropyl trialkoxysilane which hydrolyzes to a diol, caused an increase in oxide removal.

EXAMPLE 4

This Example explores the ability of polishing slurries including various amounts of silane in solution to polish copper wafers. Each of the polishing compositions used was an aqueous solution including 3 wt % fumed aluminum, 0.7 wt % ammonium oxalate, and 2.5 wt % hydrogen peroxide. The pH of each slurry was adjusted to 7.7 using KOH. Each polishing composition included various types and amounts of silanes. Table 4 below indicates the amount and type of silane included in each polishing composition tested as well as the amount of silane detected in the solution following polishing. Table 4 below also summarizes copper polishing rates, TEOS polishing rates, tantalum removal rates for each slurry tested.

Wafer polishing was performed using an Applied Materials Mirra polishing machine and a single step process with MP/IP/RRP/PS of 4/4.5/4/63/57. Polishing was performed with a

TABLE 4

| Run | Silane | Silane detected in solution | Cu Rate (Å/min) | Dia wiwnn | Ta Rate (Å/min) | TEOS Rate (Å/min) |
|---|---|---|---|---|---|---|
| 8 | None | | 8392 | 5.6 | 255 | 11 |
| 9 | 0.25% 3-[bis(2-hydroxyethyl)-amino]propyl-triethoxysilane | 0.165% | 8784 | 10.1 | 300 | 163 |
| 10 | 1.25% 3-[bis(2-hydroxyethyl)-amino]propyl-triethoxysilane | 0.867% | 8873 | 12.5 | 279 | 224 |
| 11 | 0.03% 3-cyano-propyldimethyl-chlorosilane | 0.010% | 12021 | 13.2 | 213 | 13 |

TABLE 4-continued

| Run | Silane | Silane detected in solution | Cu Rate (Å/min) | Dia wiwnn | Ta Rate (Å/min) | TEOS Rate (Å/min) |
|---|---|---|---|---|---|---|
| 12 | 0.08% 3-cyano-proplydimethyl-chlorosilane | 0.015% | 10728 | 14.5 | 242 | 9 |
| 13 | 0.3% 3-cyano-proplydimethyl-chlorosilane | 0.05% | 10842 | 14.4 | 240 | 7 |
| 14 | None | | 9493 | 19.7 | 212 | 47 |

Rodel IC 1000 over Suba IV polishing pad.

The polishing results in Table 4 show that silane modified abrasive particle containing polishing compositions polish copper features and higher rates and oxide features at lower rates than contol polishing compositions without silanes.

What we claim is:

1. A chemical mechanical polishing composition comprising a dispersion including at least one silane modified abrasive particle that is the product of the combination of a metal oxide abrasive having at least one surface metal hydroxide and at least one silane compound having the formula:

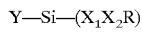

Y—Si—(X₁X₂R)

and dimers, trimers and oligomers thereof, wherein Y is hydroxy (—OH) or a hydrolyzable substituent, $X_1$ and $X_2$ are each independently selected from hydroxy, a hydrolyzable substituent, and a non-hydrolyzable substituent, and R is a non-hydrolyzable substituent wherein the non-hydrolyzable moieties are each independently selected from the group consisting of alkyl, cyloalkyl, aromatic, functionalized alkyl, functionalized aromatic, functionalized cycloalkyl, alkenes, disilane, and trisilane, one or more of which carbon atoms may be substituted with one or more atoms selected from oxygen, nitrogen, sulfur, phosphorous, halogen and combinations thereof wherein the silane is not an aminosilane and wherein the silane is not trialkyl silane.

2. The chemical mechanical polishing composition of claim 1 wherein the dispersion includes at least one solvent selected from the group consisting of water, alcohols, and combinations thereof.

3. The chemical mechanical polishing composition of claim 1 wherein the solvent is water.

4. The chemical mechanical polishing composition of claim 3 wherein the aqueous dispersion has a pH of from 2 to 11.

5. The chemical mechanical polishing composition of claim 3 wherein the aqueous dispersion has a pH of from 5 to 9.

6. The chemical mechanical polishing composition of claim 1 wherein $X_1$ and $X_2$ are each selected from the group consisting of hydroxy or a hydrolyzable substituent.

7. The chemical mechanical polishing composition of claim 6 wherein R is selected from the group of compounds including alkyl and functionalized alkyl.

8. The chemical mechanical composition of claim 6 wherein the silane compound is selected from the group consisting of glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-dihydro-1-(3-trialkoxysilylpropyl)imidazole, 3-(trialkoxysilyl)-methyl ester propanoic acid, trialkoxy(3-(oxiranylalkoxy)propyl)-silane, 2-methyl, 3-(trialkoxysilyl) propyl ester 2-propenoic acid, (3-(trialkoxysilyl)propyl) urea, and mixtures thereof.

9. The chemical mechanical polishing composition of claim 1 wherein one substituent selected from $X_1$ and $X_2$ is a non-hydrolyzable substituent.

10. The chemical mechanical polishing composition of claim 9 wherein R and the non-hydrolyzable substituent selected from $X_1$ and $X_2$ are each independently selected from the group of compounds including alkyl, functionalized alkyl, and mixtures thereof.

11. The chemical mechanical polishing composition of claim 10 wherein the silane is selected from the group consisting of chloropropylmethyldialkoxysilane, 1,2-ethanediylbis(alkoxydimethyl)silane, dialkoxymethylphenyl silane, and mixtures thereof.

12. The chemical mechanical polishing composition of claim 1 wherein $X_1$ and $X_2$ are each non-hydrolyzable moieties.

13. The chemical mechanical polishing composition of claim 12 wherein R, $X_1$ and $X_2$ are each independently selected from the group of compounds including alkyl and functionalized alkyl.

14. The chemical mechanical polishing composition of claim 13 wherein the alkyl and functionalized alkyl have from 2 to 25 carbon atoms.

15. The chemical mechanical polishing composition of claim 14 wherein each non-hydrolyzable substituent is a functionalized alkyl selected from the group consisting of alkylnitriles, alkylamides, alkylcarboxylic acids, alkyl halide, alcohol, alkyluriedo, and mixtures thereof.

16. The chemical mechanical polishing composition of claim 15 wherein at least one of the non-hydrolyzable moieties is functionalized propyl alkyl.

17. The chemical mechanical polishing composition of claim 12 wherein the silane is selected from the group consisting of cyanopropyldimethylalkoxysilane, N,N'-(alkoxymethylsilylene)bis(N-methyl-benzamide), chloromethyldimethylalkoxysilane, and mixtures thereof.

18. The chemical mechanical polishing composition of claim 1 wherein the silane is selected from the group consisting of glycidoxypropyltrialkoxysilane, isocyanatopropyltrialkoxysilane, ureidopropyltrialkoxysilane, mercaptopropyltrialkoxysilane, cyanoethyltrialkoxysilane, 4,5-dihydro-1-(3-trialkoxysilylpropyl)imidazole, 3-(trialkoxysilyl)-methyl ester propanoic acid, trialkoxy(3-(oxiranylalkoxy)propyl)-silane, 2-methyl, 3-(trialkoxysilyl) propyl ester 2-propenoic acid, (3-(trialkoxysilyl)propyl) urea, chloropropylmethyldialkoxysilane, 1,2-ethanediylbis(alkoxydimethyl)silane, dialkoxymethylphenyl silane, cyanopropyldimethylalkoxysilane, N,N'-(alkoxymethylsilylene)bis(N-methyl-benzamide), chloromethyldimethylalkoxysilane, and mixtures thereof.

19. The chemical mechanical polishing composition of claim 1 wherein the abrasive is selected from alumina, titania, zirconia, germania, silica, ceria, tantalum oxide (TaO$_x$), mixtures thereof, and chemical admixtures thereof.

20. The chemical mechanical polishing composition of claim 1 wherein the abrasive is silica.

21. The chemical mechanical polishing composition of claim 1 having a pH of from 2 to 7.7.

* * * * *

UNITED STATES PATENT AND TRADEMARK OFFICE
CERTIFICATE OF CORRECTION

PATENT NO. : 6,582,623 B1 Page 1 of 1
DATED : June 24, 2003
INVENTOR(S) : Steven Grumbine et al.

It is certified that error appears in the above-identified patent and that said Letters Patent is hereby corrected as shown below:

Column 6,
Line 23, the terms "4,5-lo dihydro" should read, -- 4,5-dihydro --.

Signed and Sealed this

Nineteenth Day of August, 2003

JAMES E. ROGAN
*Director of the United States Patent and Trademark Office*